(12) United States Patent
Lagorce et al.

(10) Patent No.: US 12,313,397 B2
(45) Date of Patent: May 27, 2025

(54) LIGHT SOURCE FOR STRUCTURED LIGHT, STRUCTURED LIGHT PROJECTION APPARATUS AND SYSTEM

(71) Applicant: PROPHESEE, Paris (FR)

(72) Inventors: Xavier Lagorce, Saint Maur des Fosses (FR); Artiom Tchouprina, Herblay (FR)

(73) Assignee: PROPHESEE, Paris (FR)

( * ) Notice: Subject to any disclaimer, the term of this patent is extended or adjusted under 35 U.S.C. 154(b) by 222 days.

(21) Appl. No.: 17/999,204

(22) PCT Filed: May 11, 2021

(86) PCT No.: PCT/EP2021/062552
§ 371 (c)(1),
(2) Date: Nov. 17, 2022

(87) PCT Pub. No.: WO2021/233746
PCT Pub. Date: Nov. 25, 2021

(65) Prior Publication Data
US 2023/0236009 A1    Jul. 27, 2023

(30) Foreign Application Priority Data
May 19, 2020   (EP) .................... 20305522

(51) Int. Cl.
*G01B 11/25* (2006.01)
*H01S 5/042* (2006.01)
*H01S 5/42* (2006.01)

(52) U.S. Cl.
CPC ...... *G01B 11/2513* (2013.01); *G01B 11/2504* (2013.01); *H01S 5/042* (2013.01); *H01S 5/423* (2013.01)

(58) Field of Classification Search
CPC . G01B 11/2513; G01B 11/2504; G01B 11/25; H01S 5/042; H01S 5/423; H01S 5/0014; H01S 5/005; H01S 5/405
See application file for complete search history.

(56) References Cited

U.S. PATENT DOCUMENTS

| | | | |
|---|---|---|---|
| 2014/0376092 A1* | 12/2014 | Mor | G01B 11/2513 359/569 |
| 2016/0197452 A1* | 7/2016 | Mor | H01S 5/423 359/569 |
| 2018/0059430 A1* | 3/2018 | Mor | H01S 5/02253 |
| 2018/0203247 A1* | 7/2018 | Chen | F21V 5/04 |
| 2019/0304110 A1 | 10/2019 | Walecki et al. | |
| 2019/0363118 A1* | 11/2019 | Berkovich | H04N 25/44 |

FOREIGN PATENT DOCUMENTS

| CN | 108036742 A | 5/2018 |
|---|---|---|
| CN | 109443245 A | 3/2019 |

\* cited by examiner

*Primary Examiner* — Jonathan M Hansen

(57) ABSTRACT

A light source for structured light, comprising a plurality of light source elements arranged in an array, wherein the light source elements are configured to be driven in the following two modes: —a calibration mode, wherein only a part of light source elements are adapted to be driven; and —a normal mode, wherein the rest of the light source elements are adapted to be driven.

15 Claims, 1 Drawing Sheet

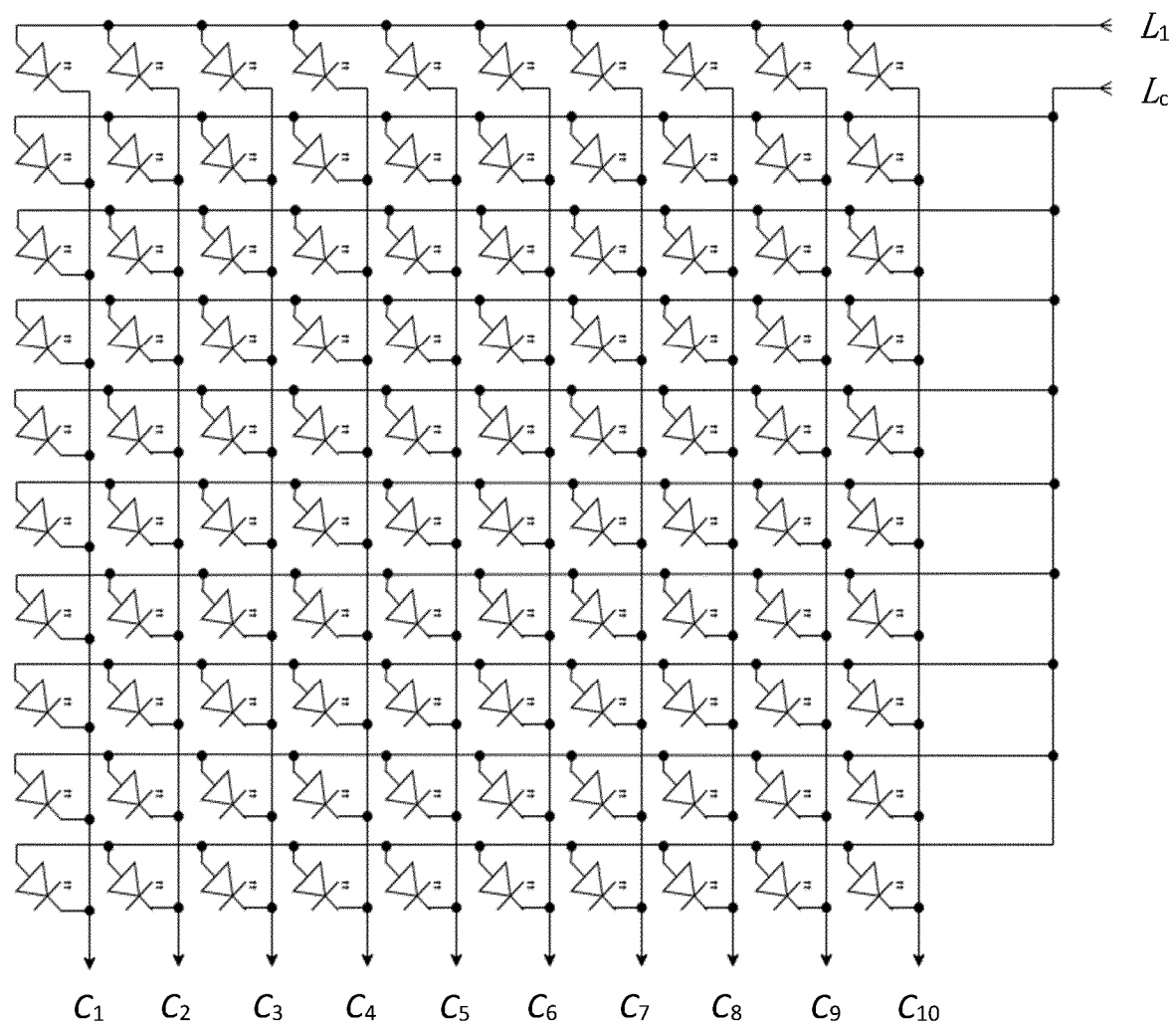

LIGHT SOURCE FOR STRUCTURED LIGHT, STRUCTURED LIGHT PROJECTION APPARATUS AND SYSTEM

FIELD OF INVENTION

The present invention relates to structured light hardware, in particular, light source for structured light, structured light projection apparatus and system.

BACKGROUND

In a structured light system, a projection apparatus projects a pattern, such as grids or horizontal/vertical bars to a scene which reflects it towards a camera, such as frame-based or event-based sensors, that acquires it. By finding specific parts of the pattern in the output of the camera, it is possible to triangulate a point in space from the position of the pattern in the camera and its position in the projection apparatus. Usually, structured light with a wavelength outside the visible spectrum can be used so as to avoid interfering with other computer vision tasks for which the projected pattern will be confusing.

The structured light system has many applications. For example, it can be used for photographing fingerprints in a 3D scene. Where previously they would use tape to extract the fingerprint and flatten it out, they can now use cameras and flatten the fingerprint digitally, which prevents the fingerprint to be physically touched and damaged. In addition, it can also be used to recognize a face of a user so as to process an identification authorization with high security level.

Since the structured light system has many technical characteristics and advantages, there are a lot of trade-offs to be made in the exact pattern to project from the point of view of the projector technology and the performances of the global system, such as density of the output depth map.

Therefore, for the structured light systems in the art, a calibration of such a structured light system is a very complex problem. In particular, at the building time, when a system needs to be calibrated not only in factory but also throughout the life of the product, because de-calibration means that its output will lose precision and/or accuracy. In this regard, the costs associated to this calibration are a huge part of the global price of a structured light system to the extent that it became a limitation to the spread of such systems.

The invention aims to improve these drawbacks.

SUMMARY

To this end, according to one aspect of the invention, it is provided a light source for structured light, comprising a plurality of light source elements arranged in an array, wherein the light source elements are configured to be driven in the following two modes:
  a calibration mode, wherein only a part of light source elements are adapted to be driven; and
  a normal mode, wherein the rest of the light source elements are adapted to be driven.

With such an arrangement according to the present invention, it is possible to have with a single projector, not only a pattern which enables dense structured light reconstruction, but also a pattern which enables calibration of the system, if a particular external element is added for the calibration process or automatic partial recalibration of the system without external steps or devices to be taken or used by the user.

In an embodiment according to the present invention, in the normal mode, some of the light sources elements driven in the calibration mode are deactivated.

In an embodiment according to the present invention, the array is a two-dimensional array containing rows and columns of the light source elements.

In addition, the rows and the columns of the light source elements extend in different directions perpendicular to each other. In particular, the rows or the columns of the light source elements are spaced in a fixed interval.

Moreover, in the calibration mode, only one row or one column of the light source elements are driven. Alternatively, in the calibration mode, only the light source elements on the periphery of the two-dimensional array are driven, for example a single light source element on the corners.

Alternatively, the two-dimensional array can also be arranged in the form of a hexagonal grid. In another embodiment according to the present invention, it further comprises a driving circuit electrically connected to the light source elements and contains a first and second sub driving circuits, wherein in the calibration mode, the first sub driving circuit drives the part of light source elements, and the second sub driving circuit is deactivated and the rest of the light source elements are not driven; in the normal mode, the first sub driving circuit drives the part of light source elements and the second sub driving circuit drives the rest of the light source elements.

In yet another embodiment according to the present invention, in the calibration mode, only part of the light source elements are adapted to generate a calibration pattern, and in the normal mode, the rest of the light source elements are adapted to generate a normal pattern, wherein some of the light sources driven in the calibration pattern might no longer be driven so that the calibration pattern can be a subset of the normal pattern or a distinct one sharing parts or none of its light elements with the normal pattern.

In yet another embodiment according to the present invention, the light source is a Vertical-Cavity Surface Emitting Laser (VCSEL) array light source or an Edge Emitting Laser (EEL) light source.

According to a second aspect of the invention, it is provided a pattern design method for a light source according to the abovementioned light source, comprising:
  generating a calibration pattern in the calibration mode;
  generating a normal pattern in the normal mode;
  wherein the calibration pattern is, for example, a subset of the normal pattern.

According to a third aspect of the invention, it is provided a projection apparatus, comprising:
  the light source as mentioned above;
  at least one optical element configured to receive and reshape a light beam emitted from the light source.

For instance, in the projection apparatus, the at least one optical element is a diffractive optical element (DOE), which has a microstructured surface that diffracts light into a desired pattern with very little loss and multiplies each light source element into several ones projected onto the scene According to a fourth aspect of the invention, it is provided a structured light system, comprising:
  the projection apparatus as mentioned above, wherein the projection apparatus is configured to emit a structured light pattern towards a target object in a space;

an image acquisition apparatus configured to observe the target object in the space which reflects the structured light pattern, so as to obtain a structured light image of the target object; and a processor configured to calculate a depth image of the target object according to a triangulation principle.

In one embodiment according to the present invention, the image acquisition apparatus is an event-based camera or a framed based camera. In case of the event-based camera, the projection apparatus and the event-based camera could be synchronized below 1 ms.

Compared with the system in the art, such as an expensive and complicated fully programmable projector, like a DLP/DMD projector, the present invention is simpler, cheaper, smaller and have better light emission capabilities.

BRIEF DESCRIPTION OF THE DRAWINGS

Other features and advantages of the present invention will appear in the description hereinafter, in reference to the appended drawing, where:

FIG. 1 illustrates an exemplary embodiment of light source for structured light according to the present invention.

DESCRIPTION OF EMBODIMENTS

As mentioned above, different applications use structured light patterns to achieve 3D depth mapping. In the present invention, a structured light system comprises:

a projection apparatus according to the present invention, which is configured to emit a structured light pattern towards a target object in a space, wherein the projection apparatus according to the present invention may comprise:

a light source according to the present invention, which will be detailed later;

optionally, at least one optical element configured to receive and reshape a light beam emitted from the light sources, such as a diffractive optical element (DOE);

an image acquisition apparatus, which is configured to observe the target object in space that reflects the structured light pattern, so as to obtain a structured light image of the target object; wherein the image acquisition apparatus is an event-based camera or a frame-based camera. For the purpose of illustration, the event-based camera is used;

and optionally a processor, which is configured to calculate a depth image of the target object according to a triangulation principle, such as specialized logic circuits (ASIC, FPGA, . . . ) or chip.

FIG. 1 shows an exemplary embodiment of light source for structured light according to the present invention. This embodiment uses an array of Vertical-Cavity Surface Emitting Laser (VCSEL) as light source, where the lasers of the array are modulated individually or in groups. The individual lasers or groups may be modulated statically or dynamically to provide and alter a structured light pattern as needed, so as to for example form IDs of different sources. Alternatively, Edge Emitting Laser (EEL) can also be used as light source according to the present invention.

In particular, in this embodiment of the light source according to the present invention, the plurality of light source elements is an array of VCSEL dots tiling the projection space directly or with the use of DOE elements. For the former, the lasers from the VCSEL dots can directly light up the scene. For the latter, the array of VCSEL dots make the elementary pattern and the DOE elements then reproduce this elementary pattern throughout space to cover the whole Field Of View (FOV) required by the application.

The array of VCSEL dots can be arranged in various kind of one-dimensional, two-dimensional or three-dimensional arrays. For example, in the case of two-dimensional array, the VCSEL dots can be arranged in rows and/or columns including a single row or column (line) which may be transformed into multiple lines or irregular doted lines by means of a DOE. Alternatively, they can also be arranged in the form of a hexagonal grid. In addition, these dots can also have a pseudo random organization over the projector, either to be used as such or transformed into, for example, vertical lines with dots having a regular horizontal spacing.

In FIG. 1, the exemplary embodiment of light source for structured light for instance comprises 100×100 VCSEL dots, distributed in a flat two-dimensional panel along columns and rows perpendicular to the columns, wherein the columns and rows are spaced in a fixed interval. For the convenience of description, in FIG. 1, the number of VCSEL dots has been reduced to 10×10. Those VCSEL dots are electrically connected, all VCSEL dots along columns C1, C2, . . . C10 are driven in the same way. In this case, the pins of the VCSELs can be tied together to reach the periphery of the array along columns. However, in this exemplary embodiment, the first top row L1 and rest rows LC are tied to the power supply respectively. Therefore, light source elements according to the present invention can be partially driven, for example, only the VCSEL dots in the first top row are driven in a calibration mode, and all the VCSEL dots are driven in a normal mode.

Such an arrangement is designed for generating vertical stripes, which eases the routing/layout of the array, because it uses several VCSEL dots instead of a DOE to make the stripes or uses several VCSEL dots to make a dotted line blurred into a line by means of a DOE, which can allow a large light output of smaller individual power of the VCSEL dots. All the connections in FIG. 1 are only to be considered logically as points driven in the same way but the actual driving circuit could be different for electrical reasons. In addition, other arrangements and layout may also be envisaged on the basis of the present invention, for example, the arrangement can be set as the first left column and the rest columns are driven separately.

The present invention is now discussed in greater detail. In the present invention, in order to obtain dense depth map reconstructions, geometrical constraints are used to reduce the complexity of the projected pattern.

First, epipolar constraints are used between the camera and the projection apparatus which is capable of generating vertical stripes of light, provided that the camera and projection apparatus are placed on a horizontal axis. Therefore, a given pattern can only be found in a given range of pixels on the camera. This makes it possible to repeat a small pattern of vertical stripes horizontally. The DOE will take care of reproducing this line pattern over the system FOV in the column and row directions, i.e. X and Y directions.

Meanwhile, the VCSEL dots may generate a pattern to enable re-calibration of the system or precise calibration from a guess of the calibration which can be obtained from the physical dimension and position in the assembly of the camera and projection apparatus. This initial constraint/guess of the calibration can be implemented with a grid of repetitive dots since matching errors are not possible when taking into account the constraints brought by that initial calibration guess. This pattern can be generated by making one line of the VCSLE dots array independent, either by routing of the other dimension (a given routing of lines and another of columns as shown in the FIG. 1 where L1 drives the first top line and LC drives the rest of them) or by routing all columns and the last one independently. Enabling only this independent line will then generate a grid of dots with independent enough patterns of IDs to be matched for calibrating the system.

In the exemplary embodiment of the FIG. 1, in normal mode, rows L1 and LC can be tied to the power supply and columns C1 to C10 will be driven to ground with the signal required to make different light patterns on each column of the array. In calibration mode, row L1 can be tied to the power supply while row LC and columns C2 to C10 can be tied to ground (or left floating), thus de-activating a large part of the array. Driving C1 will enable to drive only the top-left point of the array, activating a single light source element, such as LED.

It is also possible to choose, in the calibration mode, to drive columns C1 to C10 to obtain a line of dots each one with a different IDs. To generate more input for calibration. C1 to C10 could then be driven in the same way in normal and calibration modes, only rows LC should be switched between power supply and ground.

In this case, a driving circuit electrically can be connected to the light source elements which contains a first and second sub driving circuits, wherein in the calibration mode, the first sub driving circuit drives the part of light source elements, and the second sub driving circuit is deactivated and the rest light source elements are not driven; in the calibration mode, the first sub driving circuit drives the part of light source elements and the second sub driving circuit drives the rest light source elements.

Alternatively, it is also possible to use a driving circuit without sub driving circuits, when the different columns C1 to C10 are modulated to make a temporal pattern, wherein there are one driving circuit per column or one driving circuit which can select which column to drive at each period of the projection. In that case, moving from normal to calibration mode changes the driving sequence of the columns in the temporal pattern.

Therefore, during the calibration mode, a fundamental matrix of the system can be estimated, wherein it can be linked to the relative pose (translation and rotation) between the camera and the projection apparatus. Several methods already exist for this, wherein they rely on finding "point correspondences" between the two views (here the projection apparatus and the camera), such as eight-point algorithm, and this can be easily achieved by the system according to the present invention which enables generating a calibration pattern using part of the light source to easily find those correspondences.

During the normal mode, a normal pattern which is switched from the calibration mode may contain or overlap the calibration pattern used in the calibration mode by driving all the light source elements. The normal pattern is used for the structured light applications, such as 3D reconstruction, by means of several sophisticated algorithms in the art.

Therefore, the present invention proposes a single hardware for generating two fixed patterns, where one might be a subset of the other, one being optimized for 3D reconstruction and the other one for calibration which can allow to obtain point correspondences.

The embodiments described hereinabove are illustrations of this invention. Various modifications can be made to them without leaving the scope of the invention which stems from the annexed claims.

The invention claimed is:

1. A light source for structured light, comprising a plurality of light source elements arranged in an array, wherein the light source elements are configured to be driven in the following two modes:
   a calibration mode, wherein only a part of the light source elements are adapted to be driven to generate a calibration pattern, and the rest of the light source elements are deactivated; and
   a normal mode, wherein the rest of the light source elements are adapted to be driven to generate a normal pattern.

2. The light source according to claim 1, wherein the array is a two-dimensional array containing rows and columns of the light source elements.

3. The light source according to claim 2, wherein the rows and the columns of the light source elements extend in different directions perpendicular to each other.

4. The light source according to claim 2, wherein the rows or the columns of the light source elements are spaced in a fixed interval.

5. The light source according to claim 2, wherein in the calibration mode, only one row or one column of the light source elements are driven.

6. The light source according to claim 2, wherein in the calibration mode, only the light source elements on the periphery of the two-dimensional array are driven.

7. The light source according to claim 1, wherein the two-dimensional array is arranged in the form of hexagonal grid.

8. The light source according to claim 1, wherein it further comprises a driving circuit electrically connected to the light source elements and contains first and second sub driving circuits, wherein in the calibration mode, the first sub driving circuit drives the part of the light source elements, and the second sub driving circuit is deactivated and the rest of the light source elements are not driven; in the normal mode, the first sub driving circuit drives the part of the light source elements and the second sub driving circuit drives the rest of the light source elements.

9. The light source according to claim 1, wherein the calibration pattern is a subset of the normal pattern.

10. The light source according to claim 1, wherein the light source is a Vertical-Cavity Surface Emitting Laser array light source or an Edge Emitting Laser light source.

11. A pattern design method for a light source for structured light, wherein the light source comprises a plurality of light source elements arranged in an array, wherein the light source elements are configured to be driven in a plurality of modes including a calibration mode in which only a part of light source elements are adapted to be driven to generate a calibration pattern, and the rest of the light source elements are deactivated, and a normal mode in which the rest of the light source elements are adapted to be driven to generate a normal pattern, the method comprising:
   generating a calibration pattern in the calibration mode;
   generating a normal pattern in the normal mode;
   wherein the calibration pattern is a subset of the normal pattern.

12. A projection apparatus, comprising a light source for structured light, wherein the light source comprises a plurality of light source elements arranged in an array, wherein the light source elements are configured to be driven in a plurality of modes including a calibration mode in which only a part of light source elements are adapted to be driven to generate a calibration pattern, and the rest of the light source elements are deactivated, and a normal mode in which the rest of the light source elements are adapted to be driven to generate a normal pattern.

13. The projection apparatus according to claim 12, further comprising at least one optical element configured to receive and reshape a light beam emitted from the light source, wherein the at least one optical element comprises a diffractive optical element.

14. A structured light system, comprising:
   a projection apparatus configured to emit a structured light pattern towards a target object in a space;
   an image acquisition apparatus configured to observe the target object in the space which reflects the structured light pattern, so as to obtain a structured light image of the target object; and
   a processor configured to calculate a depth image of the target object according to a triangulation principle,
   wherein the projection apparatus comprises a light source having a plurality of light source elements arranged in an array, wherein the light source elements are configured to be driven in a plurality of modes including a calibration mode in which only a part of light source elements are adapted to be driven to generate a calibration pattern, and the rest of the light source elements are deactivated, and a normal mode in which the rest of the light source elements are adapted to be driven to generate a normal pattern.

15. The structured light system according to claim 14, wherein the image acquisition apparatus comprises an event-based camera.

* * * * *